United States Patent
Chen et al.

(10) Patent No.: US 9,741,675 B2
(45) Date of Patent: Aug. 22, 2017

(54) BUMP STRUCTURES, SEMICONDUCTOR DEVICE AND SEMICONDUCTOR DEVICE PACKAGE HAVING THE SAME

(71) Applicant: Advanced Semiconductor Engineering, Inc., Kaohsiung (TW)

(72) Inventors: Dao-Long Chen, Kaohsiung (TW); Ping-Feng Yang, Kaohsiung (TW); Chang-Chi Lee, Kaohsiung (TW); Chien-Fan Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 89 days.

(21) Appl. No.: 14/599,366

(22) Filed: Jan. 16, 2015

(65) Prior Publication Data

US 2016/0211235 A1    Jul. 21, 2016

(51) Int. Cl.
H01L 23/48 (2006.01)
H01L 23/52 (2006.01)
H01L 29/40 (2006.01)
H01L 23/00 (2006.01)

(52) U.S. Cl.
CPC .............. *H01L 24/13* (2013.01); *H01L 24/06* (2013.01); *H01L 24/11* (2013.01); *H01L 24/14* (2013.01); *H01L 24/03* (2013.01); *H01L 24/05* (2013.01); *H01L 24/16* (2013.01); *H01L 2224/0345* (2013.01); *H01L 2224/0346* (2013.01); *H01L 2224/03912* (2013.01); *H01L 2224/0401* (2013.01); *H01L 2224/05552* (2013.01); *H01L 2224/05647* (2013.01); *H01L 2224/05666* (2013.01); *H01L 2224/0614* (2013.01); *H01L 2224/119* (2013.01); *H01L 2224/1146* (2013.01); *H01L 2224/1147* (2013.01); *H01L 2224/1161* (2013.01); *H01L 2224/11849* (2013.01); *H01L 2224/131* (2013.01); *H01L 2224/13013* (2013.01); *H01L 2224/13014* (2013.01); *H01L 2224/13015* (2013.01); *H01L 2224/13083* (2013.01); *H01L 2224/13147* (2013.01); *H01L 2224/13155* (2013.01); *H01L 2224/1414* (2013.01); (Continued)

(58) Field of Classification Search
CPC ............... H01L 24/12; H01L 24/13; H01L 2224/13014; H01L 2224/13015; H01L 2224/05552
See application file for complete search history.

(56) References Cited

U.S. PATENT DOCUMENTS

| 2011/0156253 A1* | 6/2011 | Tsai | ........................ H01L 24/03 257/738 |
| 2015/0084186 A1* | 3/2015 | Chang | ........................ H01L 25/50 257/737 |

* cited by examiner

*Primary Examiner* — Jesse Y Miyoshi
(74) *Attorney, Agent, or Firm* — Foley & Lardner LLP; Cliff Z. Liu

(57) ABSTRACT

The present disclosure relates to bump structures and a semiconductor device and semiconductor device package having the same. The semiconductor device includes a body, at least one conductive metal pad and at least one metal pillar. The body includes a first surface. The at least one conductive metal pad is disposed on the first surface. Each metal pillar is formed on a corresponding conductive metal pad. Each metal pillar has a concave side wall and a convex side wall opposite the first concave side wall, and the concave side wall and the convex side wall are orthogonal to the corresponding conductive metal pad.

13 Claims, 16 Drawing Sheets

(52) U.S. Cl.
CPC ............... *H01L 2224/16055* (2013.01); *H01L 2224/16056* (2013.01); *H01L 2224/81191* (2013.01)

BUMP STRUCTURES, SEMICONDUCTOR DEVICE AND SEMICONDUCTOR DEVICE PACKAGE HAVING THE SAME

BACKGROUND

1. Technical Field

The present disclosure relates to a semiconductor device and a semiconductor device package, and more particularly to a semiconductor device with metal bump structures and a package having the same.

2. Description of the Related Art

In a semiconductor device package, a semiconductor chip (also referred to as an integrated circuit (IC) chip or die) may be bonded directly to a packaging substrate. Such semiconductor chips are formed with ball-shaped beads or bumps of solder affixed to their I/O bonding pads. During packaging, the chip is "flipped" onto its front surface (e.g., active circuit surface) so that the solder balls form electrical connections directly between the semiconductor chip and conductive metal pads, pre-solder, or traces on a packaging substrate. Packages of this type are commonly called "flip chip packages."

As advances in semiconductor technology further increase the speed of semiconductor chips, a shift towards using a silicon based (Si) die with a plurality of layers of low dielectric constant (low-K) material have been sought. Low-K material assists in the reduction of propagation delay because of the lower dielectric constant, thereby improving the electrical performance of a low-K Si die. However, such low-K material is usually very brittle and has presented significant packaging problems (e.g., such as may affect reliability of the semiconductor chips).

In a conventional technique for a flip chip package, a die and a packaging substrate are electrically connected and mechanically bonded in a solder joining operation. Heat is applied, causing the solder bumps to alloy and form electrical connections between the die and the packaging substrate. The package is then cooled to harden the connection.

An underfill may then be applied in order to enhance the mechanical bonding of the die and substrate. An underfill material, typically a thermo-set epoxy, is dispensed into the space (or "gap") between the die and the substrate. The underfill is then cured by heating.

Semiconductor packages are typically subject to temperature cycling during normal operation. A problem with flip chip package constructions as described above is that during the cool down from the solder joining temperature and the underfill curing, the whole package is highly stressed due to the different coefficients of thermal expansion (CTEs) of the substrate and die materials. Shrinkage of the substrate, typically an organic material having a relatively high CTE, is greater than shrinkage of the die, which typically is silicon-based and has a much lower CTE. The high stress experienced by these bonded materials during cooling may cause them to warp or crack and cause the package structure to bow. Consequently, the bow of the package may exceed a co-planarity specification for flip chip packages.

With the introduction of low-K Si dice and extra-low-K Si dice in flip chip packages, the problems experienced by conventional flip chip packages are of even greater significance. This is because, as compared to traditional dielectric materials in conventional silicon based dice, low-K dielectric materials are brittle, and tend to crack under substantially less mechanical or thermal stress. As such, it is possible for the reliability of the low-K Si die to be compromised due to cracking of the low-K dielectric material. In addition, the mismatches in thermal expansion between the low-k dielectric material, silicon based die, and substrate can lead to delamination or collapse of the low-K material in the packaged low-K Si die during its manufacture or during its use in the field. Low-K Si die's susceptibility to cracking, delaminating, or collapsing of the low-K material is generally applicable to all sizes of dice. Consequently, lower yield, poorer reliability, and higher costs may occur in the manufacturing and use of both the low-K Si dice themselves as well as the overall low-K Si die flip chip packages.

Accordingly, what is needed are low-K Si die flip chip packages that control package warpage within acceptable limits for incorporation into electronic devices, and that redistribute the package's internal stresses in enhancing both the low-K Si die and the low-K Si die flip chip package reliabilities.

SUMMARY

In accordance with an embodiment of the present disclosure, a semiconductor device includes a body, at least one conductive metal pad and at least one metal pillar. The body includes a first surface. The at least one conductive metal pad is disposed on the first surface. Each metal pillar is formed on a corresponding conductive metal pad. Each metal pillar has a concave side wall and a convex side wall opposite the first concave side wall, and the concave side wall and the convex side wall are orthogonal to the corresponding conductive metal pad.

In accordance with another embodiment of the present disclosure, a metal bump structure includes at least one metal pillar and a solder layer. An outer boundary of the metal bump structure comprises a first curve and a second curve opposite the first curve, wherein a center of curvature of the first curve and a center of curvature of the second curve fall on a same side of the at least one metal bump structure.

In accordance with an embodiment of the present disclosure, a semiconductor device package includes a semiconductor device, a package substrate and at least one metal pillar. The semiconductor device has an active surface. The package substrate has a top surface. The at least one metal pillar is connected between the active surface of the semiconductor device and the top surface of the package substrate. Each metal pillar has a concave side wall and a convex side wall opposite the concave side wall.

In accordance with an embodiment of the present disclosure, a semiconductor device package includes a semiconductor device, a package substrate and at least one metal bump structure. The semiconductor device has an active surface. The package substrate has a top surface. The at least one metal bump structure is connected between the active surface of the semiconductor device and the top surface of the package substrate. An outer boundary of each metal bump structure has a first curve and a second curve opposite the first curve, wherein a center of curvature of the first curve and a center of curvature of the second curve fall on a same side of the at least one metal bump structure.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
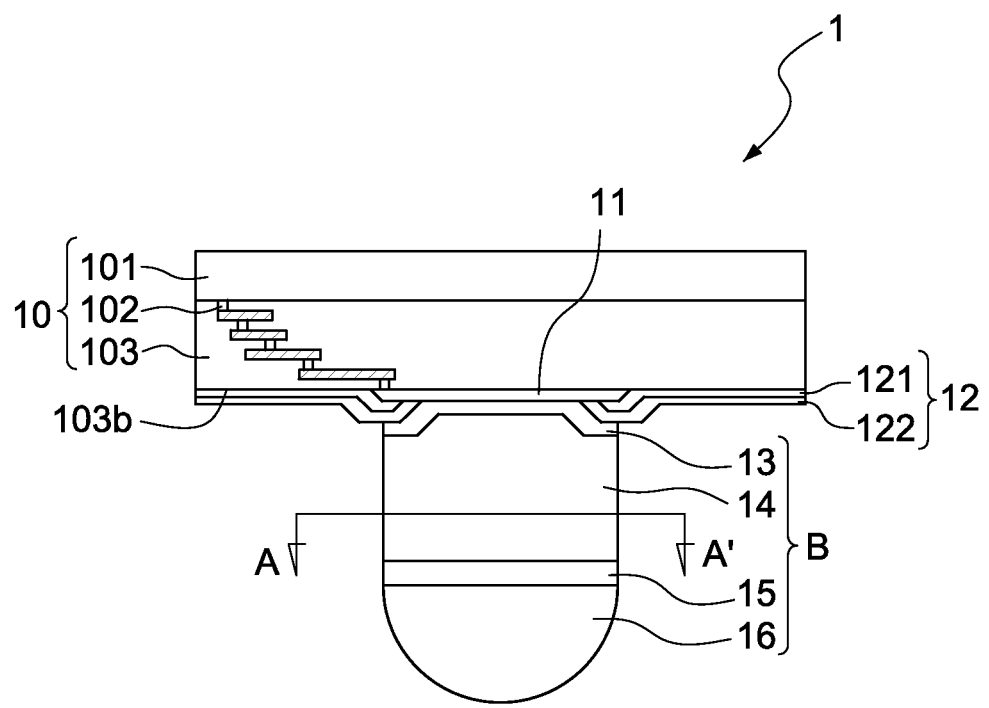
FIG. 1 illustrates a cross-sectional view of a semiconductor device in accordance with an embodiment of the present disclosure.

FIG. 1 illustrates a cross-sectional view of a semiconductor device 1 in accordance with an embodiment of the present disclosure. The semiconductor device 1 includes a body 10, a conductive metal pad 11, a passivation layer 12 and a metal bump structure B, which includes an under-bump metallurgy (UBM) layer 13, a metal pillar 14, a buffer layer 15 and a solder layer 16.

The semiconductor device 1 may be a device die or chip that includes active devices such as transistors (not shown) therein, although the semiconductor device 1 may also be an interposer that does not have active devices therein.

The body 10 includes a substrate 101 and an interconnect structure which includes metal lines and vias 102 and inter-metal dielectrics (IMDs) 103. The interconnect structure may also include an inter-layer dielectric (ILD, not shown). In an embodiment wherein semiconductor device 1 is a device die, the substrate 101 may be a semiconductor substrate such as a silicon substrate, although it may include other semiconductor materials. The interconnect structure, which includes metal lines and vias 102 and IMDs 103, is formed on the substrate 101. Metal lines and vias 102 may be formed of copper or copper alloys or other metals or metal alloys, and may be formed, for example, by using a damascene processes. IMDs 103 may comprise low-K dielectric materials, and may have dielectric constants (K values) lower than about 3.0. The low-K dielectric materials may also be extreme low-k dielectric materials having K values lower than about 2.5.

The conductive metal pad 11, which may be part of the interconnect structure, is formed on a first surface 103b of the body 10. The conductive metal pad 11 may be formed of aluminum or aluminum alloy, or other metal or metal alloy.

The passivation layer 12 is formed on the body 10 to cover a portion of the conductive metal pad 11 and the first surface 103b. The passivation layer 12 exposes the other portion of the conductive metal pad 11. In some embodiments, the passivation layer 12 has a multi-layer structure, such as the two-layer structure illustrated in FIG. 1 including a first passivation layer 121 and a second passivation layer 122. The first passivation layer 121 may be, or may include, silicon nitride, which may protect the conductive metal pad 11 from oxidation. The second passivation layer 122 may be, for example, polyimide, which may provide stress absorption during assembly operation. In some embodiments, the passivation layer 12 has a single layer structure, which may be, for example, polyimide.

The UBM layer 13 is disposed on the exposed portion of the conductive metal pad 11 and on a portion of the passivation layer 12.

The metal pillar 14 is disposed on the UBM layer 13. In one embodiment, the metal pillar 14 may be formed as a metal post. The metal pillar 14 may be a copper-containing pillar or a copper pillar, or may alternatively be, or may include, another metal (or alloy) or combination of metals (or alloys). The buffer layer 15 is formed on the metal pillar 14 includes nickel, but may alternatively be another buffering metal or metal combination. The solder layer 16 is formed on the buffer layer 15.

Figure 1A:
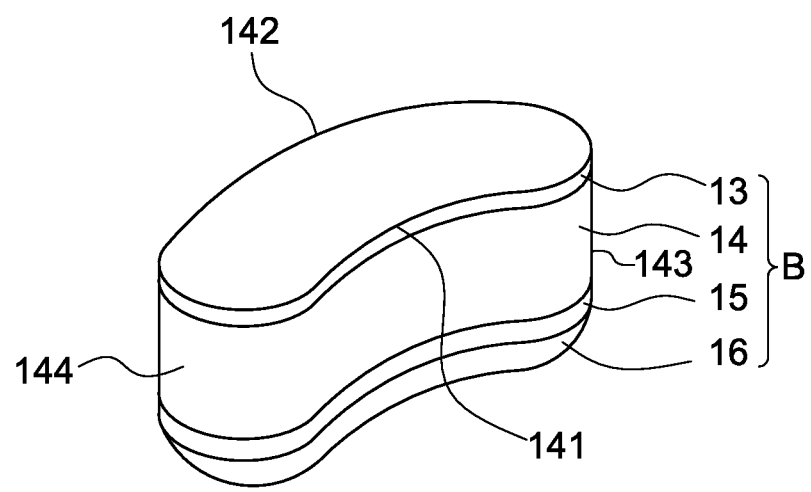
FIG. 1A illustrates a perspective view of a metal bump structure as shown in FIG. 1.

FIG. 1A illustrates a perspective view of the metal bump structure B of FIG. 1. FIG. 1A shows an outer boundary of the metal bump structure B, illustrating that the outer boundaries of the included UBM layer 13, metal pillar 14, buffer layer 15 and solder layer 16 before solder reflow are the same (i.e., within manufacturing tolerances).

The metal pillar 14 has a concave side wall 141 and a convex side wall 142 opposite the concave side wall 141. In some embodiments, the concave side wall 141 is an arc of a first circle, and the convex side wall 142 is an arc of a second circle different from the first circle. Referring back to FIG. 1, the concave side wall 141 and the convex side wall 142 are orthogonal or perpendicular to the conductive metal pad 11. In this context, orthogonal encompasses a range of angles corresponding to 90°±10°, such as 90°±5°, ±4°, ±3°, ±2°, ±1°, ±0.5°, ±0.1°, or ±0.05°.

Referring again to FIG. 1A, the metal pillar 14 further comprises a first end wall 143 and a second end wall 144. Each of the first end wall 143 and the second end wall 144 connects the concave side wall 141 and the convex side wall 142. The first end wall 143 is a convex wall having a first radius of curvature. The second end wall 144 is a convex wall having a second radius of curvature. In some embodiments, the first radius of curvature is substantially the same as the second radius of curvature. In some embodiments, the first radius of curvature is different from the second radius of curvature. In some embodiments, the first end wall 143 has a hemispherical shape. In some embodiments, the second end wall 144 has a hemispherical shape.

Figure 1B:
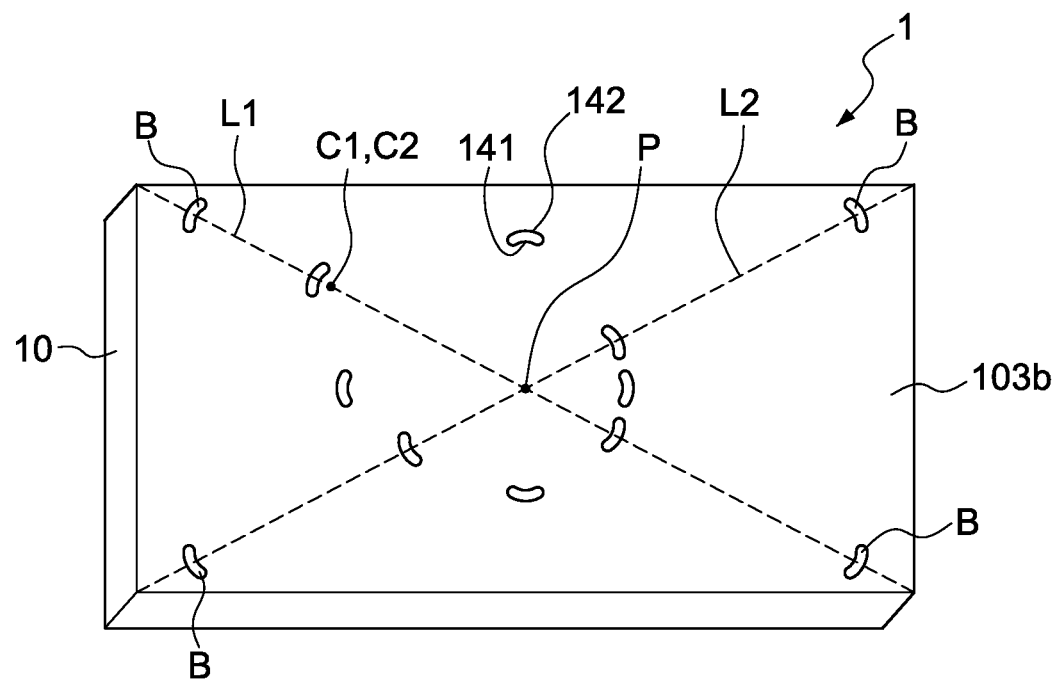
FIG. 1B illustrates a bottom view of the semiconductor device as shown in FIG. 1.

FIG. 1B illustrates a bottom view of a semiconductor device, such as a semiconductor device including multiple bump structures B as illustrated in FIG. 1 and FIG. 1A. Referring to FIG. 1B, the first surface 103b of the body 10 is rectangular. Some of the metal bump structures B are disposed close to corners of the first surface 103b, some are disposed on a diagonal (denoted as L1 and L2 for reference) of the first surface 103b, and some are disposed at other positions on the first surface 103b. Each metal bump structure B is formed on a corresponding conductive metal pad 11. Each metal bump structure B is arranged such that the concave side wall 141 is closer to a center P of the first surface 103b than is the convex side wall 142. In some embodiments, a center C1 of curvature of the concave side wall 141 falls on the diagonal L1 or L2 of the first surface 103b. In some embodiments, a center C2 of curvature of the convex side wall 142 falls on the diagonal L1 or L2 of the first surface 103b. In some embodiments, each of the metal bump structures B have the centers of curvature of the concave side wall 141 and the convex side wall 142 falling on a line extending through center P of the first surface 103b, although in other embodiments, some metal bump structures B may be oriented differently. Further, the centers of curvature of the concave side wall 141 and the convex side wall 142 may not be aligned with each other, as seen, for example, in FIGS. 5 and 9, discussed below.

Figure 2:
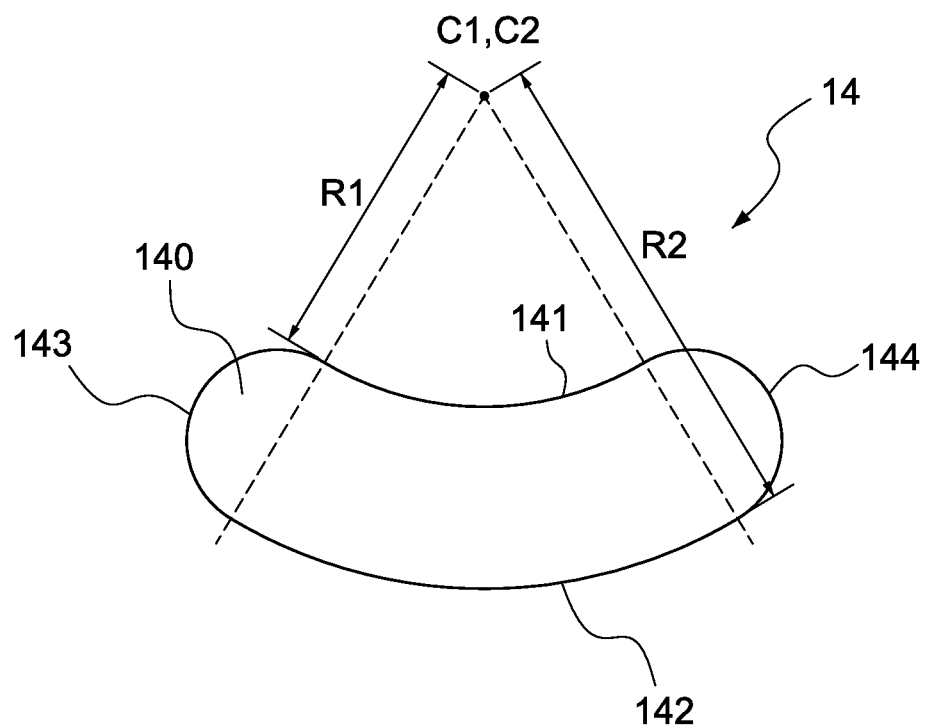
FIG. 2 illustrates a cross-sectional view across line AA' as shown in FIG. 1, in accordance with an embodiment of the present disclosure.

FIG. 2 illustrates a cross-sectional view of the metal pillar 14 across line AA' in FIG. 1, in accordance with an embodiment of the present disclosure.

FIG. 2 shows an outer boundary of the metal pillar 14, which is the same (i.e., within manufacturing tolerances) as the outer boundaries of the UBM layer 13, the buffer layer 15 and the solder layer 16 before solder reflow. The outer boundary of the metal pillar 14 includes the concave side wall 141, the convex side wall 142, the first end wall 143, and the second end wall 144.

A center C1 of curvature of the concave side wall 141 and a center C2 of curvature of the convex side wall 142 fall on a same side of the metal pillar 14. In the embodiment of FIG. 2, the he center C1 of curvature coincides with the center C2 of curvature. In other embodiments, the center of curvature C1 and the center of curvature C2 do not coincide.

In some embodiments, the curve of the concave side wall 141 may represent an arc of a first circle, and the curve of the convex side wall 142 may represent an arc of a second circle having a radius R2 different from a radius R1 of the first circle. In the embodiment of FIG. 2, where the centers of curvature C1 and C2 coincide, R2 is greater than R1. In other embodiments, R1 may be greater than R2.

Although the concave side wall 141 and the convex side wall 142 have been described as having circle radii of R1 and R2, respectively, it should be understood that one or both of the centers of curvature C1 and C2 may represent centers of curvature of elliptical shapes instead. Further, one or both of the concave side wall 141 and the convex side wall 142 may be formed in curved shapes not defined by circle radii or elliptical shapes. A few examples of alternative structures are provided with respect to FIGS. 3-9 and related text, below.

The first end wall 143 and the second end wall 144 are convex. In some embodiments, a radius of curvature of the first end wall 143 is identical to a radius of curvature of the second end wall 144. For example, in some embodiments, both the first end wall 143 and the second end wall 144 each represent an arc of a semicircle having a radius of (R2−R1)/2. In some embodiments, the radius of curvature of the first end wall 143 is different from the radius of curvature of the second end wall 144.

Figure 3:
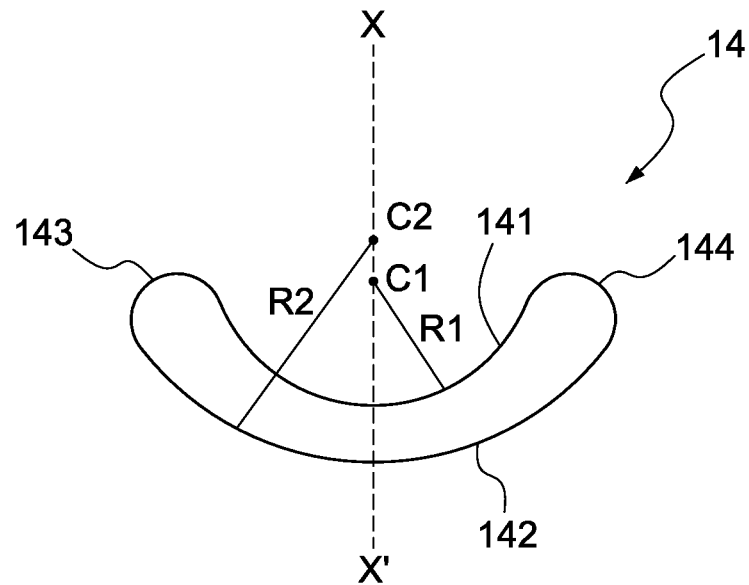
FIG. 3 illustrates a cross-sectional view across line AA' as shown in FIG. 1, in accordance with another embodiment of the present disclosure.

FIG. 3 illustrates a cross-sectional view of the metal pillar 14, across line AA' in FIG. 1, in accordance with another embodiment of the present disclosure. The outer boundary of the metal pillar 14 embodiment shown in FIG. 3 is similar to the outer boundary illustrated and described with reference to the embodiment of FIG. 2, except that the center C1 of curvature of the concave side wall 141 and the center C2 of curvature of the convex side wall 142 are separated on a line of symmetry XX', and the center C1 of curvature is closer to the concave side wall 141 than is the center of curvature C2.

Figure 4:
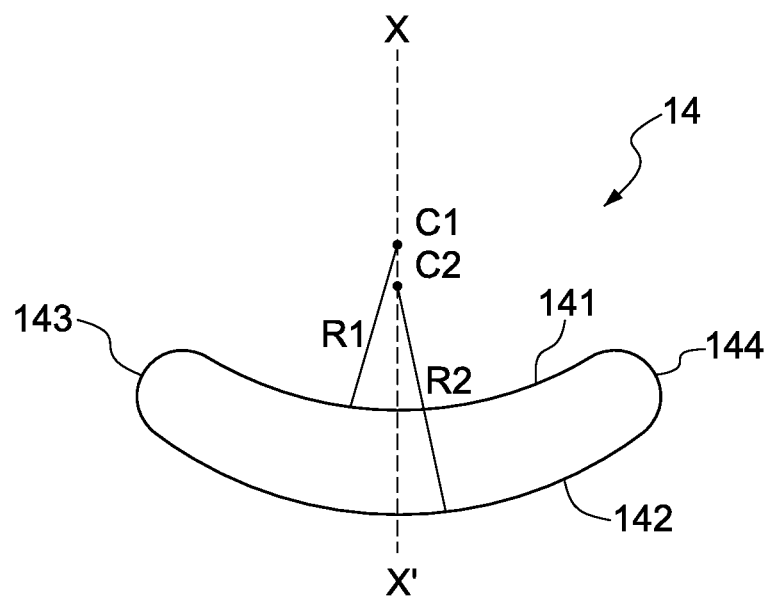
FIG. 4 illustrates a cross-sectional view across line AA' as shown in FIG. 1, in accordance with another embodiment of the present disclosure.

FIG. 4 illustrates a cross-sectional view of the metal pillar 14, across line AA' in FIG. 1, in accordance with another embodiment of the present disclosure. The outer boundary of the metal pillar 14 embodiment shown in FIG. 4 is similar to the outer boundary illustrated and described with reference to the embodiment of FIG. 3, except that the center of curvature C2 is closer to the concave side wall 141 than is the center of curvature C1.

Figure 5:
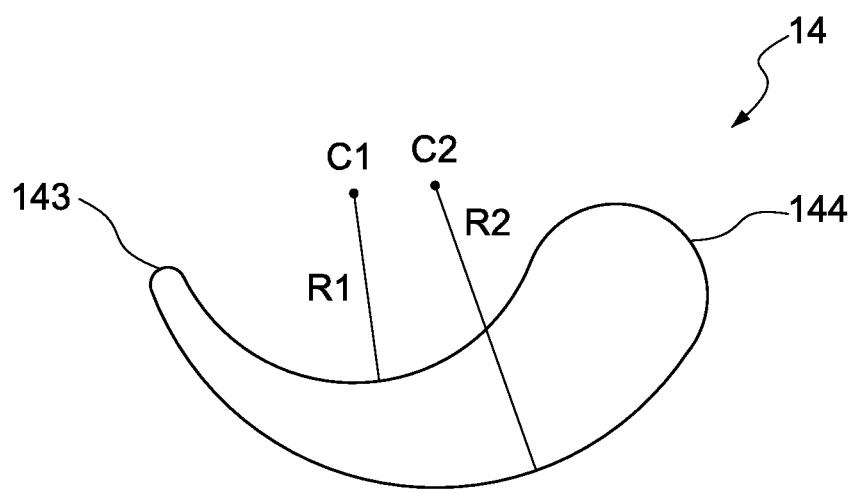
FIG. 5 illustrates a cross-sectional view across line AA' as shown in FIG. 1, in accordance with another embodiment of the present disclosure.

FIG. 5 illustrates a cross-sectional view of the metal pillar 14, across line AA' in FIG. 1, in accordance with another embodiment of the present disclosure. The outer boundary of the metal pillar 14 embodiment shown in FIG. 5 is similar to the outer boundary illustrated and described with reference to the embodiment of FIG. 4, except that the radius of curvature of the first end wall 143 is smaller than the radius of curvature of the second end wall 144 due to the asymmetry of the placement of the centers of curvature C1 and C2.

Figure 6:
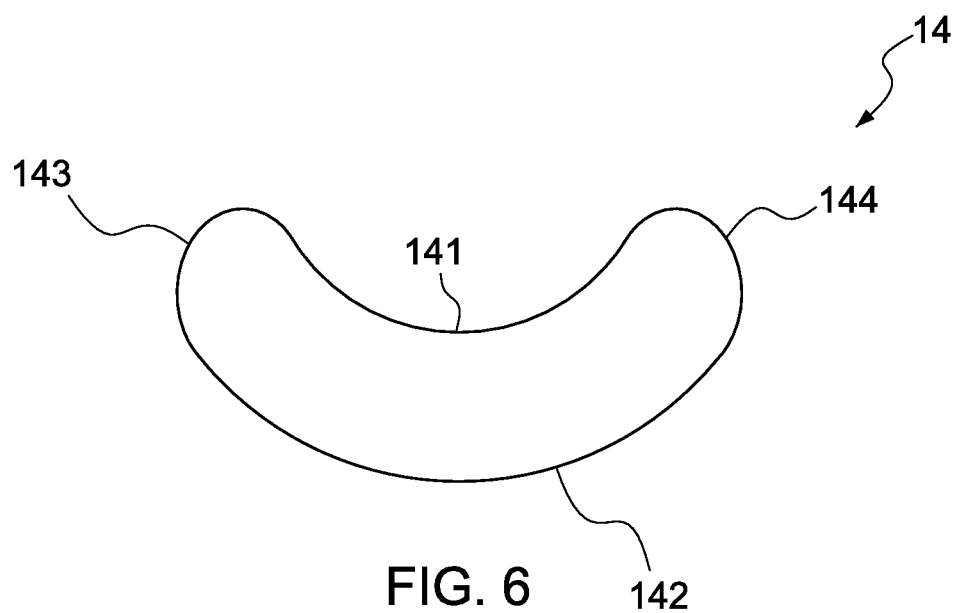
FIG. 6 illustrates a cross-sectional view across line AA' as shown in FIG. 1, in accordance with another embodiment of the present disclosure.

FIG. 6 illustrates a cross-sectional view of the metal pillar 14, across line AA' in FIG. 1, in accordance with another embodiment of the present disclosure. The outer boundary of the metal pillar 14 embodiment shown in FIG. 6 is similar to the outer boundary illustrated and described with reference to the embodiment of FIG. 2, except that the respective radius of curvature and the respective location of the center of curvature of some or all of the concave side wall 141, the convex side wall 142, the first end wall 143 and the second end wall 144 are different than shown in FIG. 2.

Figure 7:
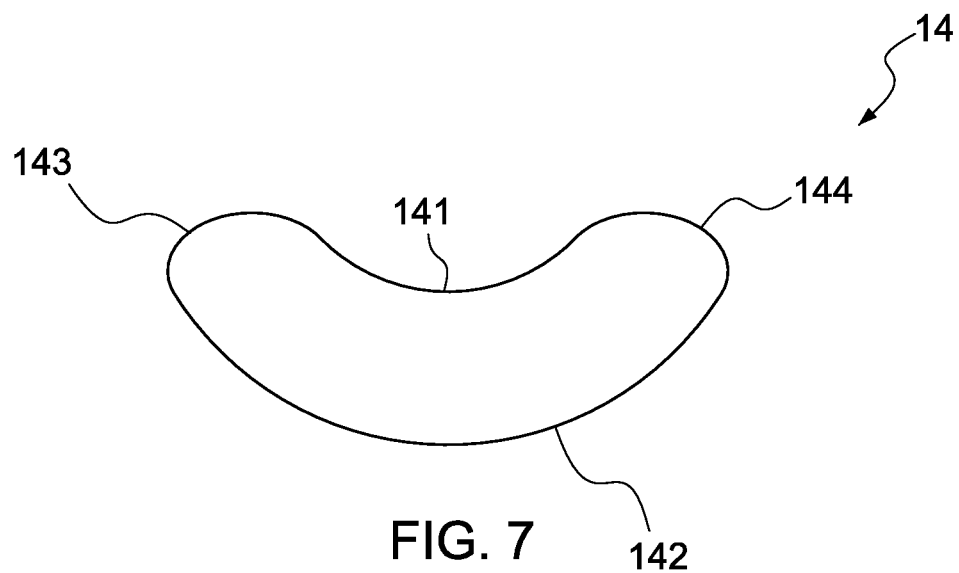
FIG. 7 illustrates a cross-sectional view across line AA' as shown in FIG. 1, in accordance with another embodiment of the present disclosure.

FIG. 7 illustrates a cross-sectional view of the metal pillar 14, across line AA' in FIG. 1, in accordance with another embodiment of the present disclosure. The outer boundary of the metal pillar 14 embodiment shown in FIG. 7 is similar to the outer boundary illustrated and described with reference to the embodiment of FIG. 2, except that the respective radius of curvature and the respective location of the center of curvature of some or all of the concave side wall 141, the convex side wall 142, the first end wall 143 and the second end wall 144 are different than shown in FIG. 2.

Figure 8:
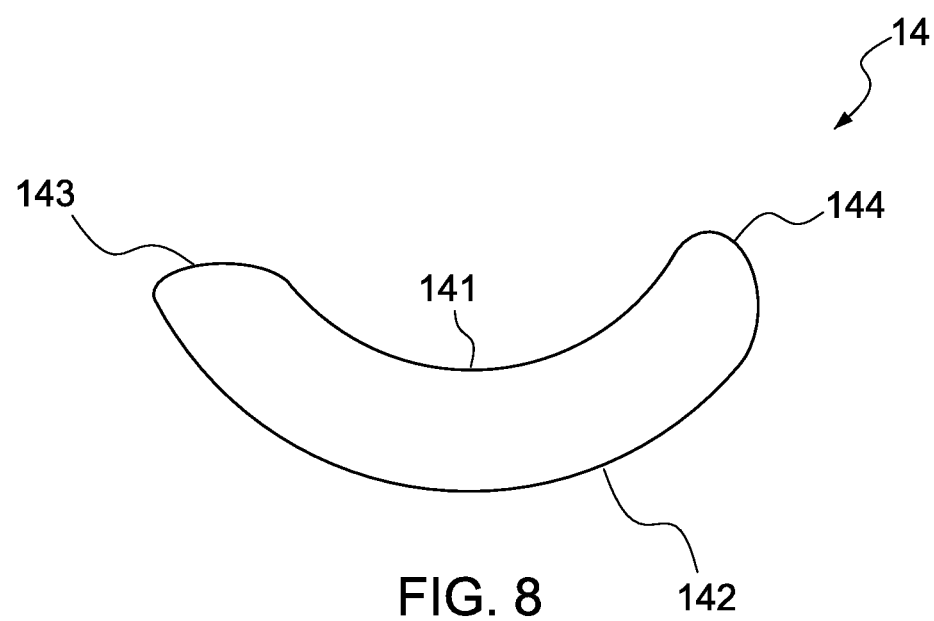
FIG. 8 illustrates a cross-sectional view across line AA' as shown in FIG. 1, in accordance with another embodiment of the present disclosure.

FIG. 8 illustrates a cross-sectional view of the metal pillar 14, across line AA' in FIG. 1, in accordance with another embodiment of the present disclosure. The outer boundary of the metal pillar 14 embodiment shown in FIG. 8 is similar to the outer boundary illustrated and described with reference to the embodiment of FIG. 2, except that the respective radius of curvature and the respective location of the center of curvature of some or all of the concave side wall 141, the convex side wall 142, the first end wall 143 and the second end wall 144 are different than shown in FIG. 2.

Figure 9:
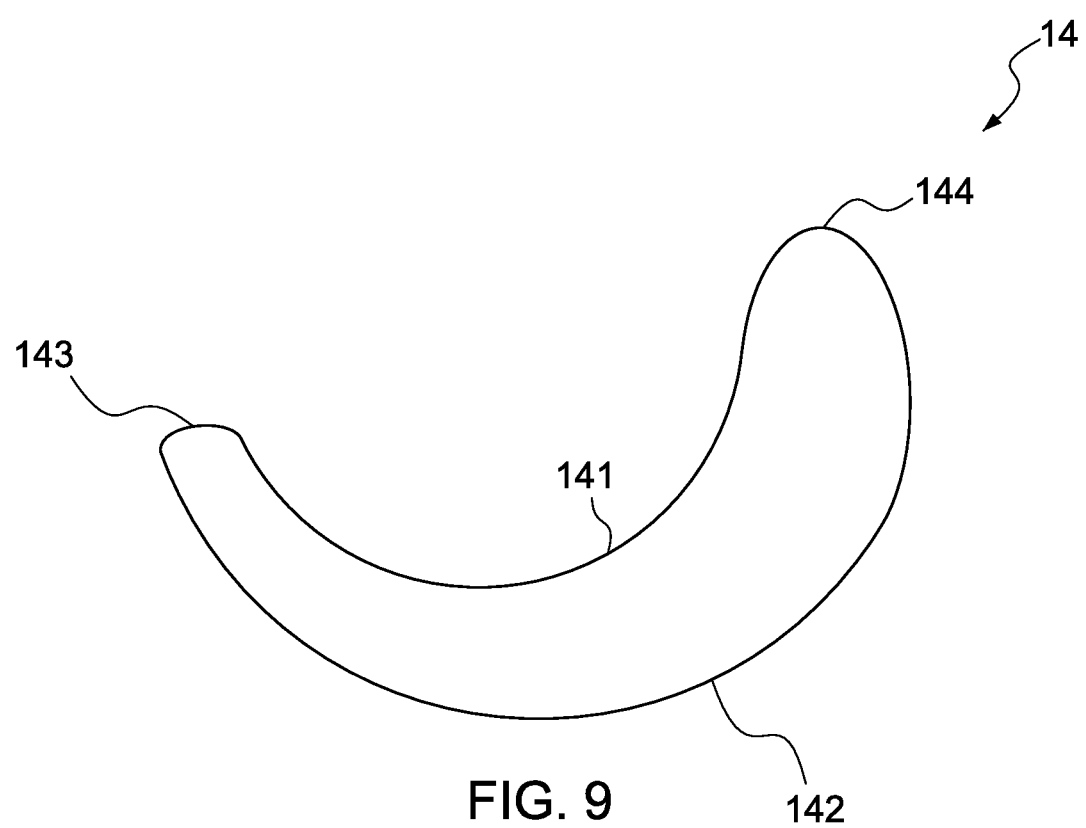
FIG. 9 illustrates a cross-sectional view across line AA' as shown in FIG. 1, in accordance with another embodiment of the present disclosure.

FIG. 9 illustrates a cross-sectional view of the metal pillar 14, across line AA' in FIG. 1, in accordance with another embodiment of the present disclosure. The outer boundary of the metal pillar 14 embodiment shown in FIG. 9 is similar to the outer boundary illustrated and described with reference to the embodiment of FIG. 2, except that the respective radius of curvature and the respective location of the center of curvature of some or all of the concave side wall 141, the convex side wall 142, the first end wall 143 and the second end wall 144 are different than shown in FIG. 2.

In some embodiments, the metal pillar 14 has a circular cross-section. In such an embodiment, the center of metal pillar 14 may experience concentration stress of up to about 2.99 gigapascal (GPa).

In some embodiments, the metal pillar 14 has an oval cross-section. In such an embodiment, the center of metal pillar 14 may experience concentration stress of up to about 1.62 GPa.

In some embodiments, the metal pillar 14 has a rectangular cross-section. In such an embodiment, the center of metal pillar 14 may experience concentration stress of up to about 1.91 GPa.

The contours or outer boundaries as illustrated and described with reference to FIG. 2, FIG. 3, FIG. 4, FIG. 5, FIG. 6, FIG. 7, FIG. 8 and FIG. 9 may redistribute the mechanical and thermal stress experienced during assembly and operation. For example, the center of the metal pillar 14 as illustrated and described with reference to FIG. 2 may experience concentration stress of up to about 1.36 GPa. Accordingly, about 54.5% of the concentration stress is redistributed as compared to a metal pillar 14 having a circular cross-section, about 16% of the concentration stress is redistributed as compared to a metal pillar 14 having an oval cross-section, and about 29% of the concentration stress is redistributed as compared to a metal pillar 14 having a rectangular cross-section.

FIG. 10A, FIG. 10B, FIG. 10C, FIG. 10D, FIG. 10E, FIG. 10F, FIG. 10G, FIG. 10H and FIG. 10I illustrate a manufacturing method in accordance with an embodiment of the present disclosure.

Figure 10A:
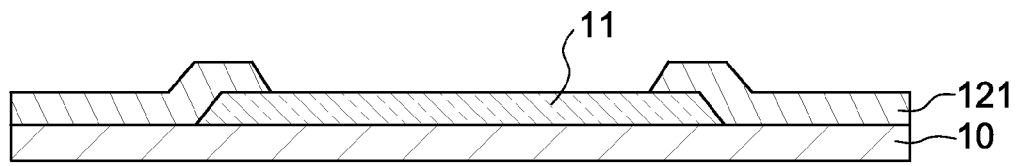
FIG. 10A, FIG. 10B, FIG. 10C, FIG. 10D, FIG. 10E, FIG. 10F, FIG. 10G, FIG. 10H and FIG. 10I illustrate a manufacturing method in accordance with an embodiment of the present disclosure.

Referring to FIG. 10A, a body 10 is provided. A conductive metal pad 11 is formed on an active surface of the body 10. A first passivation layer 121 is formed to cover the body 10 and a portion of the conductive metal pad 11. The other portion of the conductive metal pad 11 is exposed by the first passivation layer 121. The conductive metal pad 11 may include, but is not limited to, copper, aluminum, or another suitable metal or alloy. The first passivation layer 121 may include, but is not limited to, silicon nitride or other suitable material that may protect the conductive metal pad 11 from oxidation.

Figure 10B:
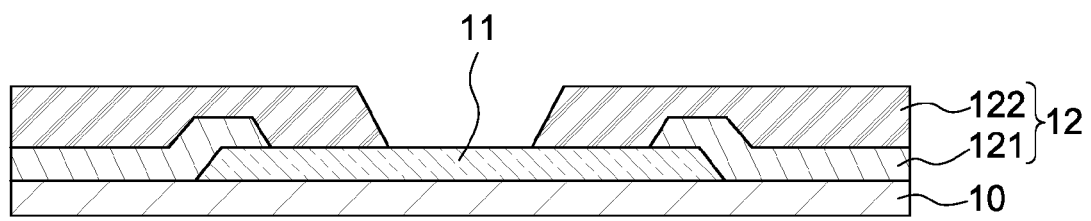

Referring to FIG. 10B, a second passivation layer 122 is coated on the first passivation layer 121 and the conductive metal pad 11 to expose a portion of the conductive metal pad 11. The second passivation layer 122 may include, but is not limited to, polyimide or other suitable material that may provide stress absorption during assembly operation.

Figure 10C:
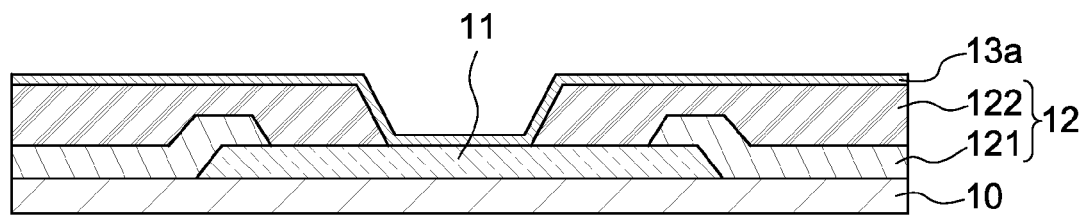

Referring to FIG. 10C, a metallurgy layer 13a is formed on the second passivation layer 122 and the exposed conductive metal pad 11. The metallurgy layer 13a may be formed, for example, by a sputtering technique. The metallurgy layer 13a may include, but is not limited to, copper, titanium, or another suitable metal or alloy.

Figure 10D:
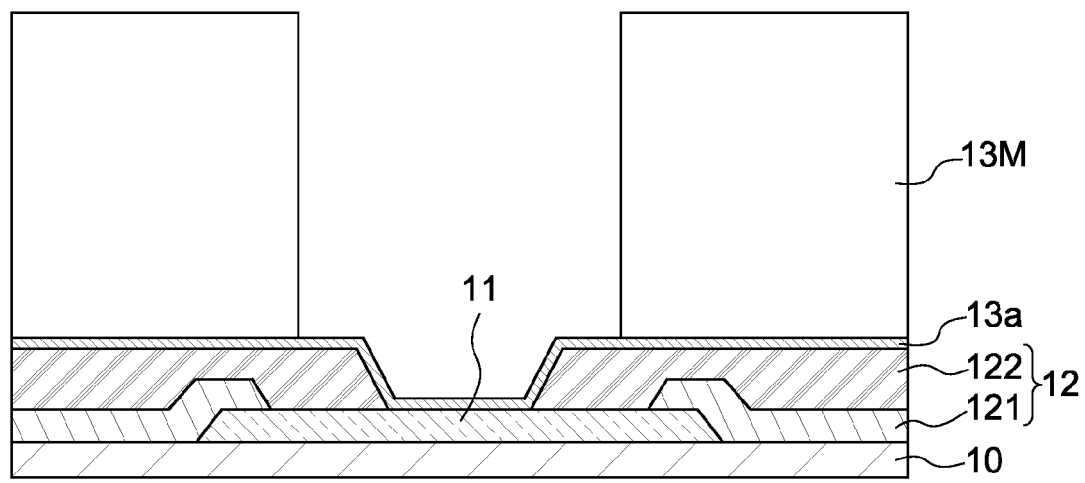

Referring to FIG. 10D, a patterned mask 13M is formed on the metallurgy layer 13a to expose a portion of the metallurgy layer 13a. The exposed portion of the metallurgy layer 13a may have an outer boundary similar to that of the metal bump structure B as illustrated and described with reference to the embodiments of FIG. 1A or FIGS. 3-9. The patterned mask 13M may be formed, for example, by a photo-lithography technique.

Figure 10E:
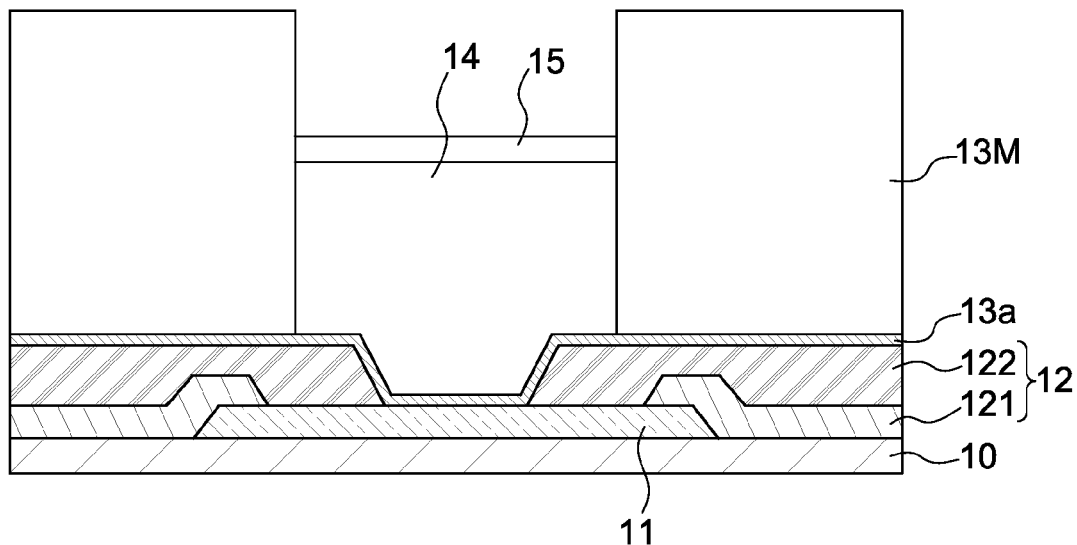

Referring to FIG. 10E, a metal pillar 14 is formed on the exposed portion of the metallurgy layer 13a, and a buffer layer 15 is formed on the metal pillar 14. The metal pillar 14 and the buffer layer 15 may be formed, for example, by a plating technique. The metal pillar 14 may include, but is not limited to, copper or another suitable metal or alloy. The buffer layer 15 may include, but is not limited to, nickel or another suitable metal or alloy.

Figure 10F:
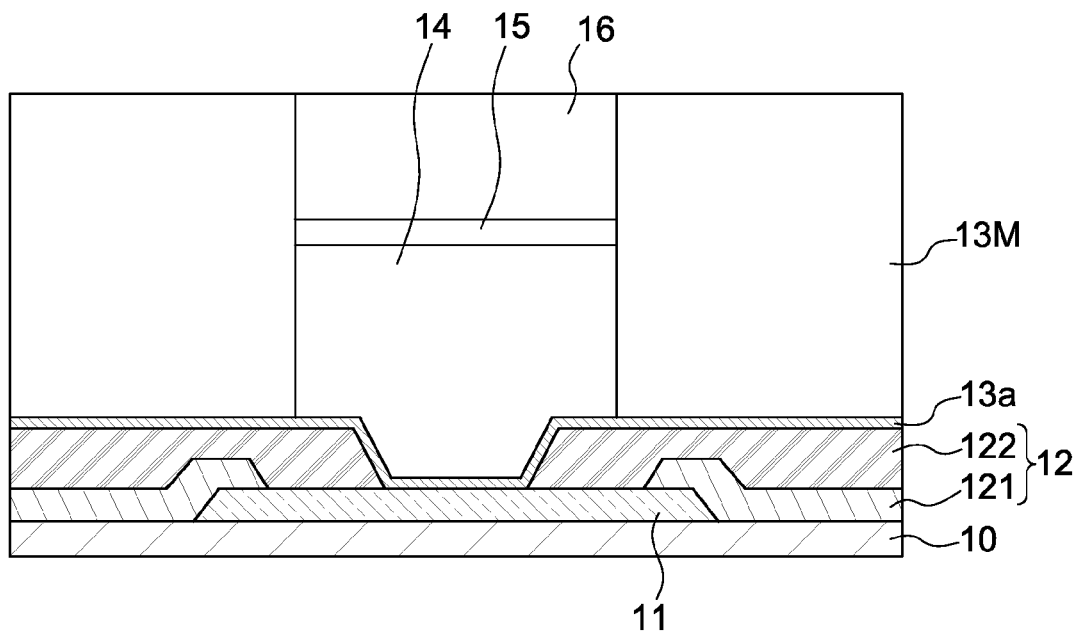

Referring to FIG. 10F, a solder layer 16 is formed on the buffer layer 15. The solder layer 16 may be formed, for example, using photo-lithography and etching techniques.

Figure 10G:
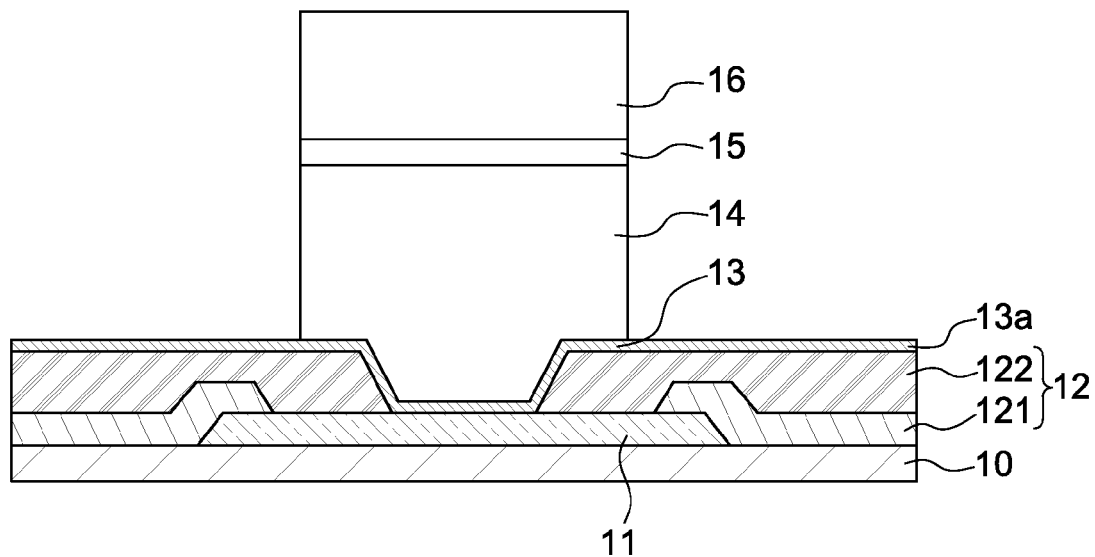

Referring to FIG. 10G, the patterned mask 13M is removed.

Figure 10H:
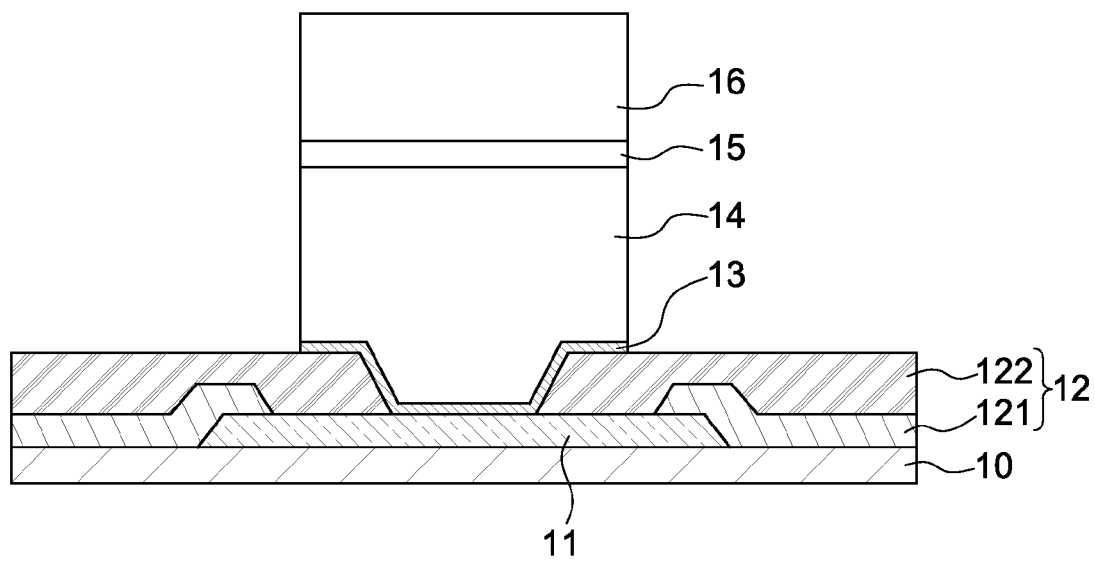

Referring to FIG. 10H, a portion of the metallurgy layer 13a not covered by metal bump 14 is removed to form a UBM layer 13. The UBM layer 13 may be formed, for example, by a plating technique.

Figure 10I:
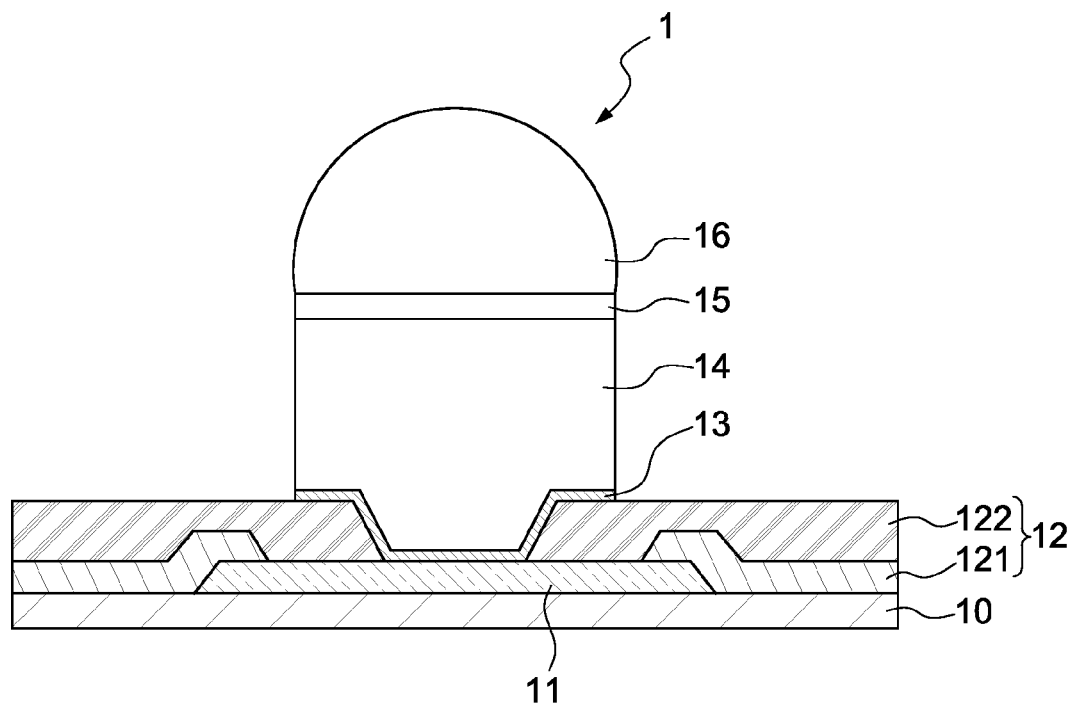
Figure 11A:
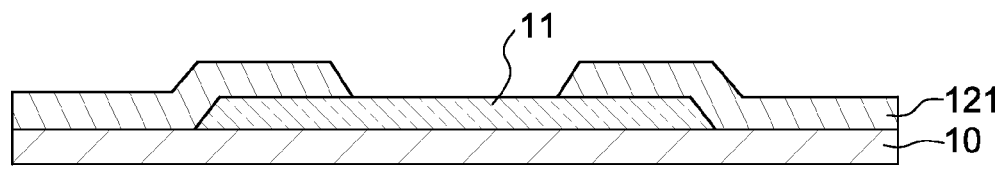
FIG. 11A, FIG. 11B, FIG. 11C, FIG. 11D, FIG. 11E, FIG. 11F, FIG. 11G, and FIG. 11H illustrate a manufacturing method in accordance with another embodiment of the present disclosure.
Figure 11B:
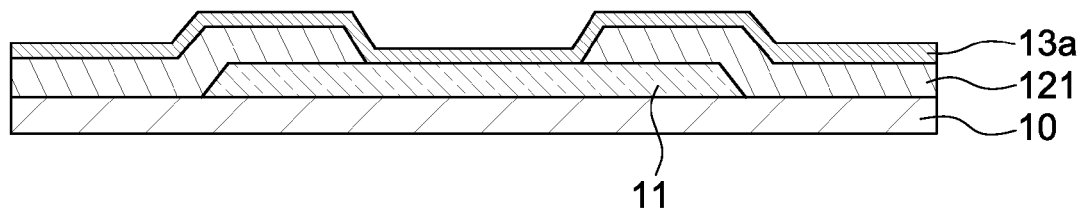
Figure 11C:
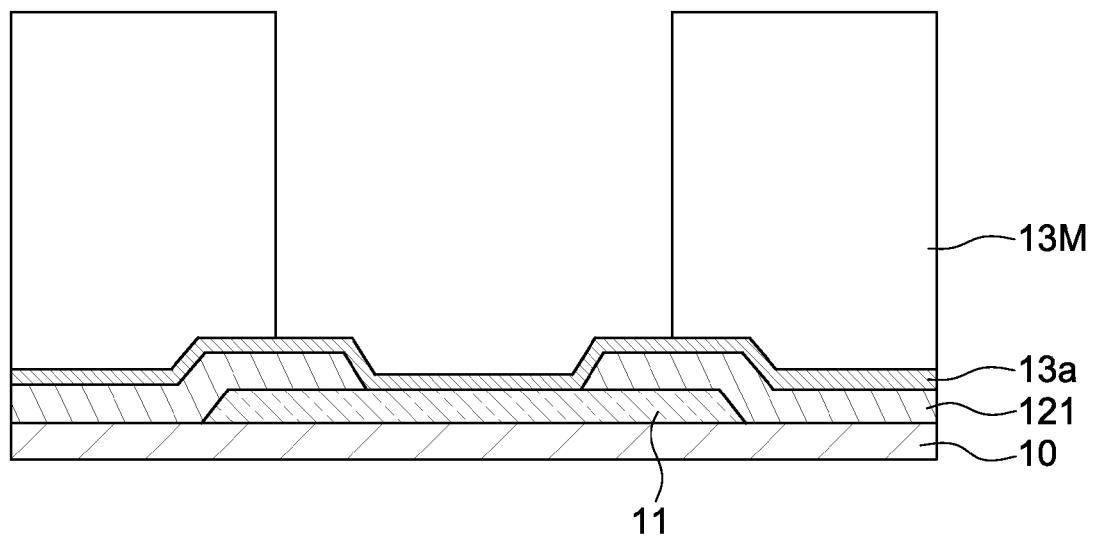
Figure 11D:
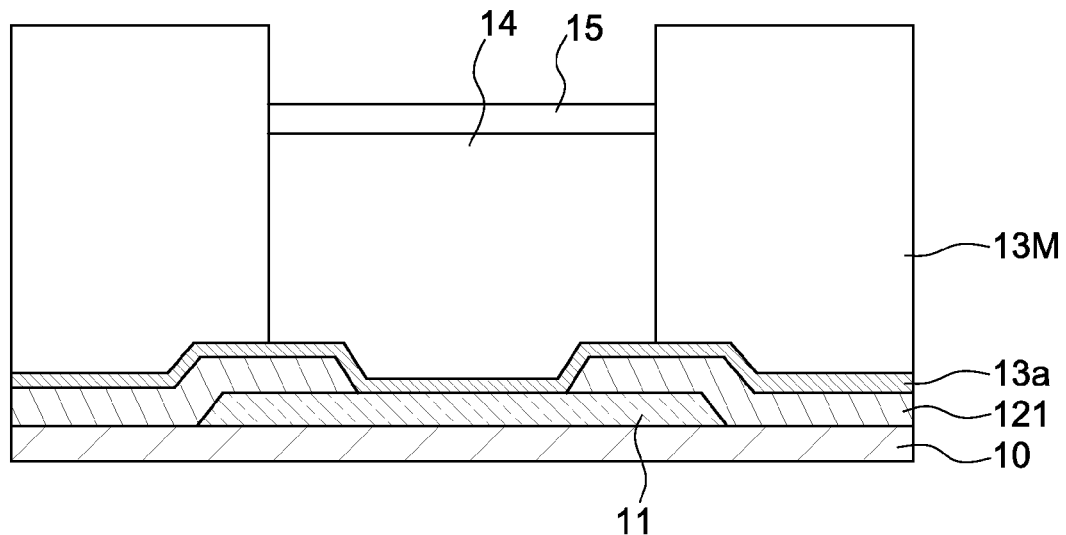
Figure 11E:
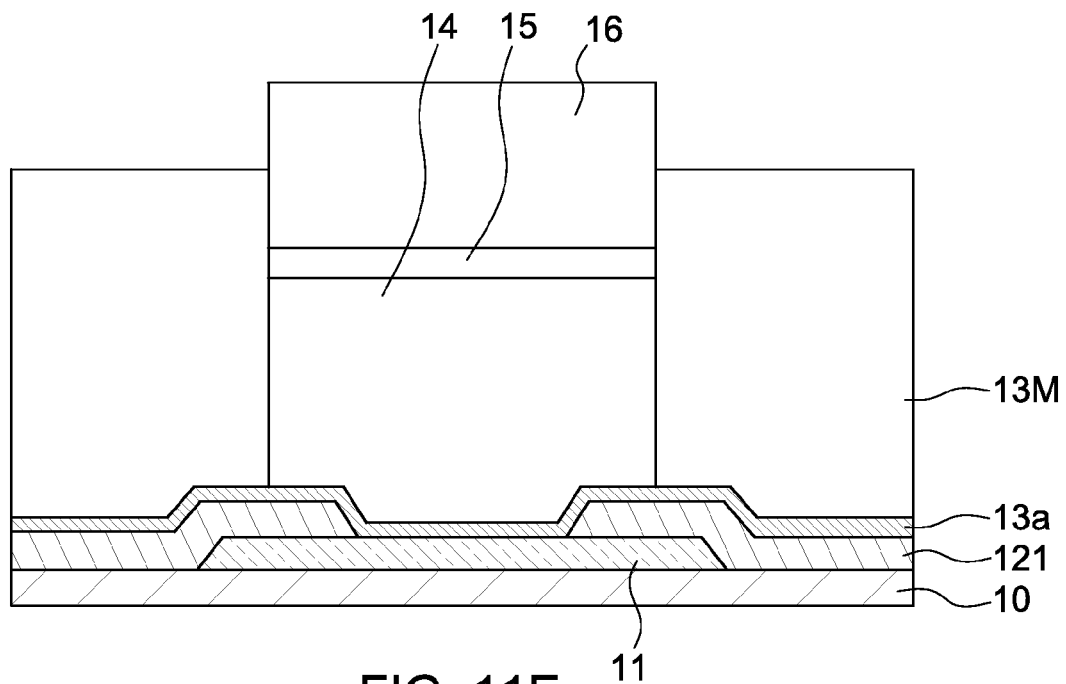
Figure 11F:
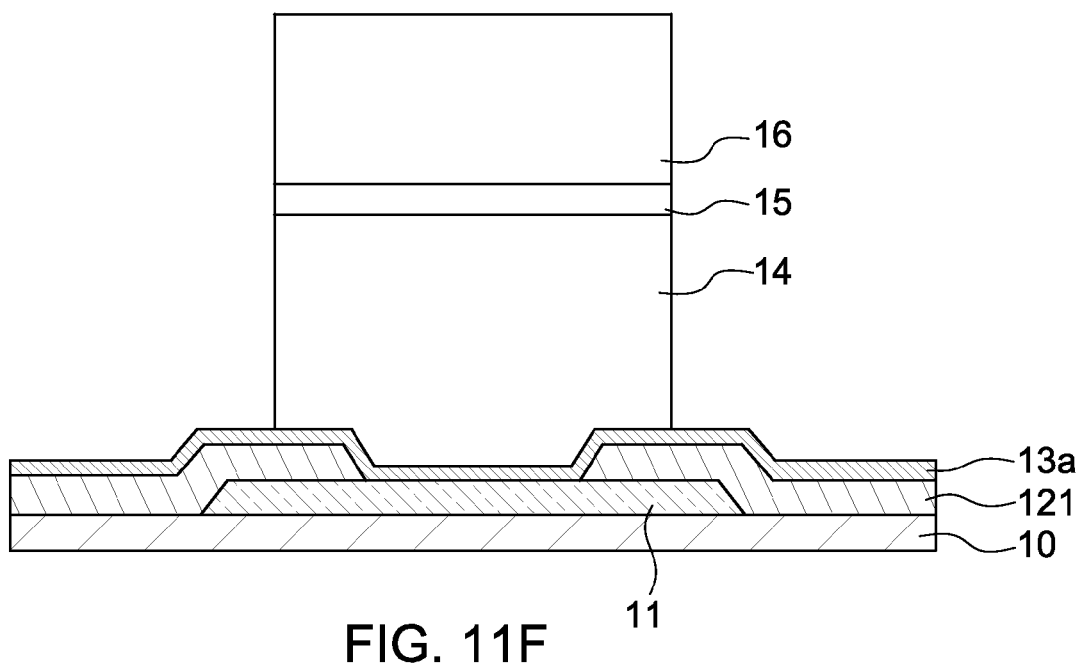
Figure 11G:
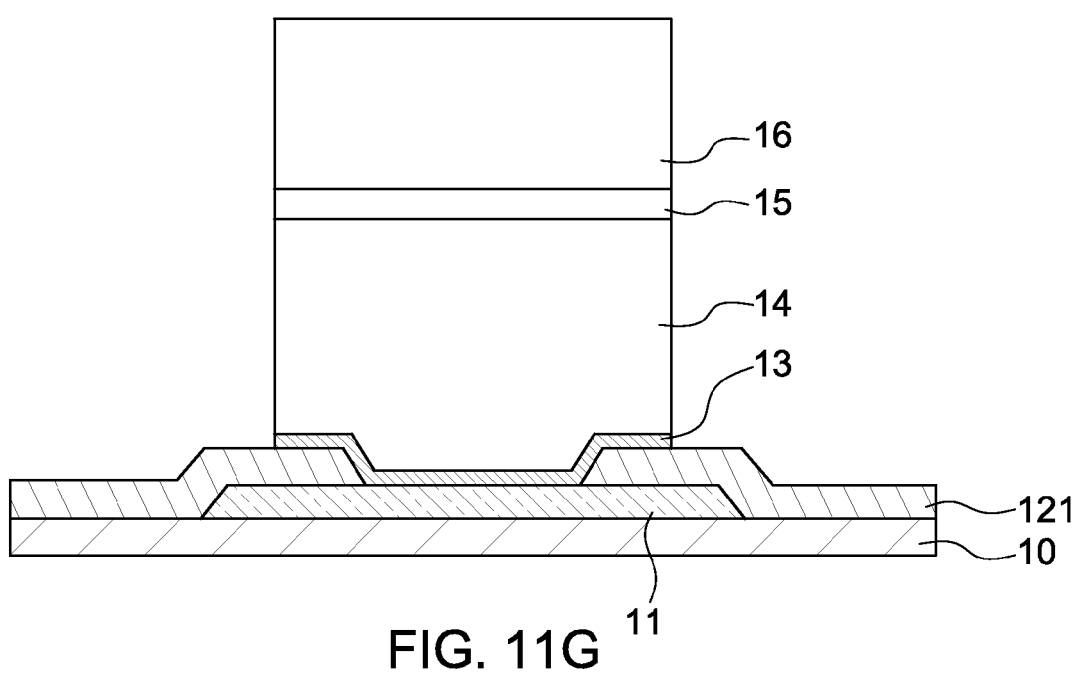
Figure 11H:
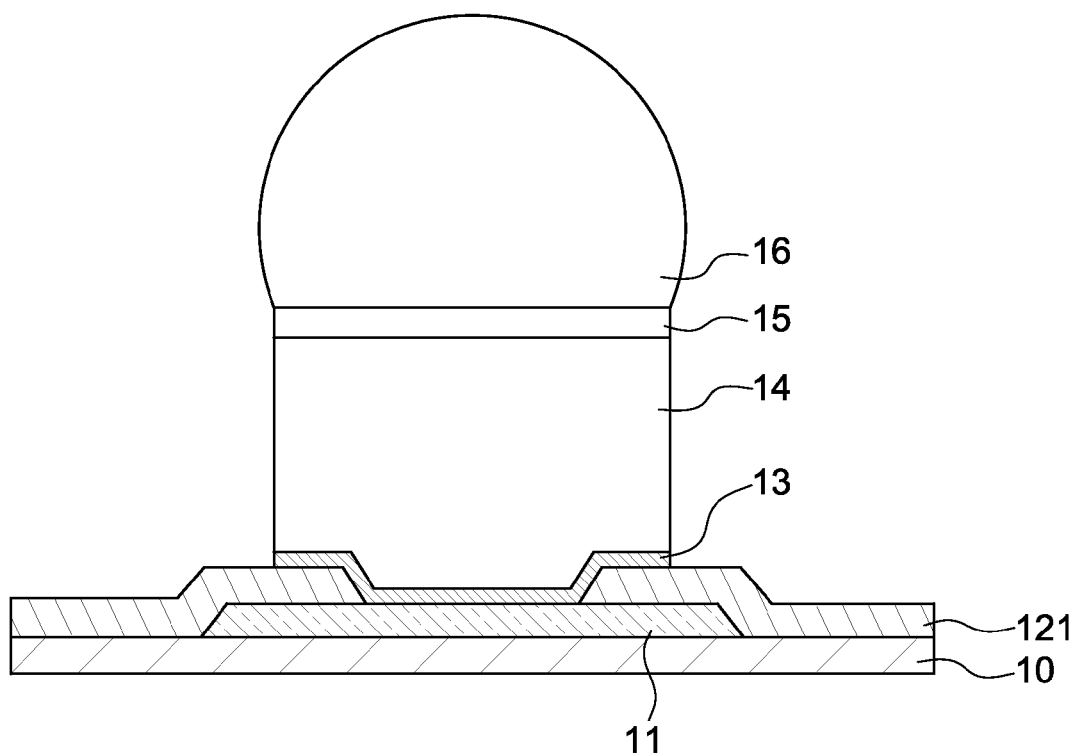

Referring to FIG. 10I, the solder layer 16 is reflowed to form a semiconductor device 1 as illustrated in FIG. 1.

FIG. 11A, FIG. 11B, FIG. 11C, FIG. 11D, FIG. 11E, FIG. 11F, FIG. 11G, and FIG. 11H illustrate a manufacturing method in accordance with another embodiment of the present disclosure. The manufacturing method illustrated in FIG. 11A, FIG. 11B, FIG. 11C, FIG. 11D, FIG. 11E, FIG. 11F, FIG. 11G, and FIG. 11H is similar to the manufacturing method as illustrated and described with reference to FIG. 10A, FIG. 10B, FIG. 10C, FIG. 10D, FIG. 10E, FIG. 10F, FIG. 10G, FIG. 10H and FIG. 10I, except that the forming of the second passivation layer 122 is eliminated.

Figure 12:
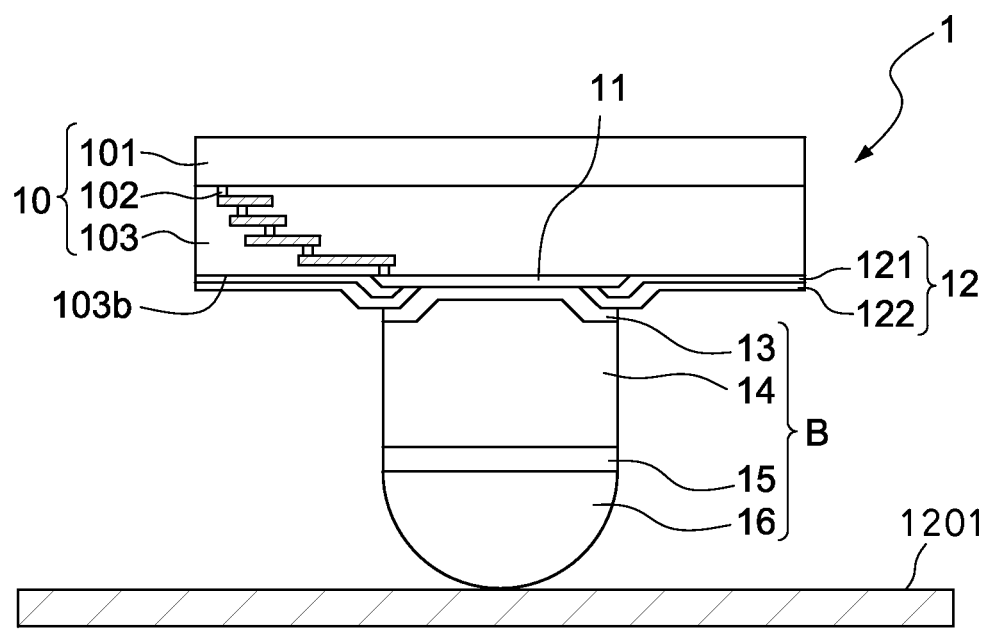
FIG. 12 illustrates a semiconductor device package.

FIG. 12 illustrates a semiconductor device package during formation, including a semiconductor device 1 and a package substrate 1201. Semiconductor device 1 is as described with respect to FIGS. 1, 1A and 1B. A metal bump structure B is formed on an active surface of the semiconductor device 1. The metal bump structure B can be implemented as described in the foregoing. Package substrate 1201 includes a top surface, and the metal bump structure is connected to the top surface of the package substrate 1201.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
a body comprising a first surface;
at least one conductive metal pad disposed on the first surface; and
at least one metal pillar, wherein each metal pillar is formed on a corresponding one of the at least one conductive metal pad and comprises a concave side wall and a convex side wall opposite the concave side wall, a center of curvature of the concave side wall coinciding with a center of curvature of the convex side wall, the concave side wall and the convex side wall being orthogonal to the corresponding conductive metal pad, wherein each metal pillar further comprises a first end wall and a second end wall, each of the first end wall and the second end wall connects the concave side wall and the convex side wall, the first end wall and the second end wall being orthogonal to the corresponding conductive metal pad.

2. The semiconductor device of claim 1, wherein the first end wall is a convex wall comprising a first radius of curvature, and the second end wall is a convex wall comprising a second radius of curvature.

3. The semiconductor device of claim 2, wherein the first radius of curvature is substantially the same as the second radius of curvature.

4. The semiconductor device of claim 1, wherein the shape of the concave side wall represents an arc of a first circle, and the shape of the convex side wall represents an arc of a second circle different from the first circle.

5. The semiconductor device of claim 1, wherein the first surface of the body has a rectangular shape, and the at least one metal pillar is disposed close to a corner of the first surface.

6. The semiconductor device of claim 5, wherein the at least one metal pillar is disposed on a diagonal of the first surface.

7. The semiconductor device of claim 1, wherein the at least one metal pillar is oriented such that the concave side wall is closer to a center of the first surface than is the convex side wall.

8. The semiconductor device of claim 7, wherein the center of curvature of the concave side wall of the at least one metal pillar falls on a diagonal of the first surface.

9. The semiconductor device of claim 7, wherein the center of curvature of the convex side wall of the least one metal pillar falls on a diagonal of the first surface.

10. A metal bump structure, comprising:
at least one metal pillar; and
a solder layer;
wherein an outer boundary of the metal bump structure comprises a first curve and a second curve opposite the first curve, wherein a center of curvature of the first curve and a center of curvature of the second curve coincide and fall on a same side of the at least one metal bump structure, wherein the outer boundary of the metal bump structure further comprises a first curved end and a second curved end, and each of the first curved end and the second curved end connects the first curve and the second curve.

11. The metal bump structure of claim 10, wherein the first curved end is convex and comprises a first radius of curvature and the second curved end is convex and comprises a second radius of curvature.

12. A semiconductor device package, comprising:
a semiconductor device comprising an active surface;
a package substrate comprising a top surface; and
at least one metal bump structure connected between the active surface of the semiconductor device and the top surface of the package substrate, each metal bump structure comprising a concave side wall and a convex side wall opposite the concave side wall, the shape of the concave side wall representing an arc of a first circle, the shape of the convex side wall representing an arc of a second circle different from the first circle, the concave side wall and the convex side wall being orthogonal to the active surface, wherein each metal bump structure further comprises a first end wall and a second end wall, each of the first end wall and the second end wall connects the concave side wall and the convex side wall, the first end wall and the second end wall being orthogonal to the active surface.

13. A semiconductor device package, comprising:
a semiconductor device comprising an active surface;
a package substrate comprising a top surface; and
at least one metal bump structure connected between the active surface of the semiconductor device and the top surface of the package substrate, an outer boundary of each metal bump structure comprising a first curve and a second curve opposite the first curve, wherein a center of curvature of the first curve and a center of curvature of the second curve fall on a same side of the at least one metal bump structure, wherein the outer boundary of each metal bump structure further comprises a first curved end and a second curved end, and each of the first curved end and the second curved end connects the first curve and the second curve, wherein the center of curvature of the first curve and the center of curvature of the second curve of the at least one metal bump structure fall on a line extending through a center of the top surface.

* * * * *